(12) United States Patent
Kim et al.

(10) Patent No.: US 7,282,842 B2
(45) Date of Patent: Oct. 16, 2007

(54) PLASMA DISPLAY APPARATUS

(75) Inventors: Ki-Jung Kim, Cheonan-si (KR); Kyoung-Ho Kang, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 59 days.

(21) Appl. No.: 10/992,647

(22) Filed: Nov. 22, 2004

(65) Prior Publication Data

US 2005/0116644 A1    Jun. 2, 2005

(30) Foreign Application Priority Data

Nov. 27, 2003 (KR) ...................... 10-2003-0084879

(51) Int. Cl.
- *H01J 1/02* (2006.01)
- *H01J 17/49* (2006.01)
- *G09G 3/10* (2006.01)

(52) U.S. Cl. .................... 313/46; 313/582; 315/169.4; 361/681; 361/688; 361/800; 361/831

(58) Field of Classification Search .................. 313/46, 313/582, 583, 584, 585, 586, 587; 315/169.4; 362/294; 361/681, 688, 800, 816, 831
See application file for complete search history.

(56) References Cited

U.S. PATENT DOCUMENTS

| | | | |
|---|---|---|---|
| 4,917,466 A * | 4/1990 | Nakamura et al. .......... | 349/151 |
| 6,366,264 B1 * | 4/2002 | Kurumada .................... | 345/60 |
| 6,522,543 B2 * | 2/2003 | Kurihara et al. ............. | 361/704 |
| 6,703,702 B2 * | 3/2004 | Inoue et al. ................. | 257/684 |
| 2004/0262744 A1 * | 12/2004 | Dahl et al. .................. | 257/712 |

FOREIGN PATENT DOCUMENTS

| | | | |
|---|---|---|---|
| JP | 2003108017 A | * | 4/2003 |
| KR | 10-2003-0011647 | | 2/2003 |

* cited by examiner

*Primary Examiner*—Mariceli Santiago
*Assistant Examiner*—Anne M Hines
(74) *Attorney, Agent, or Firm*—H. C. Park & Associates, PLC

(57) ABSTRACT

A plasma display apparatus for discharging heat from a lateral surface of a device. The plasma display apparatus includes a display panel, a chassis base supporting the display panel, and a circuit unit supported by the chassis base and for driving the display panel. A signal transmission unit couples the display panel and the circuit unit and includes at least one device mounted on itself. A lateral heat radiation member surrounds a lateral portion of the device to diffuse heat from the lateral portion of the device.

14 Claims, 7 Drawing Sheets

PLASMA DISPLAY APPARATUS

CROSS REFERENCE TO RELATED APPLICATION

This application claims priority to and the benefit of Korean Patent Application No. 10-2003-0084879, filed on Nov. 27, 2003, which is hereby incorporated by reference for all purposes as if fully set forth herein.

BACKGROUND OF THE INVENTION

1. Field of the Invention

The present invention relates to a plasma display apparatus, and more particularly, to a plasma display apparatus for radiating heat.

2. Discussion of the Related Art

A conventional plasma display apparatus shown in FIG. 1 and FIG. 2 includes a display panel 20 for displaying an image, a chassis base 40 for supporting the display panel 20, circuit units 50 to drive the display panel 20, signal transmission units 52 coupling the display panel 20 to the circuit units 50, and a shielding plate 60 for protecting the signal transmission units 52.

The display panel 20 includes a front panel 21 and a rear panel 22. The rear panel 22 may be attached to a front surface of the chassis base 40 by dual-adhesive tape 33. Additionally, a panel heat radiation member 30 may be disposed between the display panel 20 and the chassis base 40. Reinforcing members 41, which reinforce the strength of the chassis base 40 and the circuit units 50, are installed on a back surface of the chassis base 40.

A device 55 may be mounted on the signal transmission units 52.

The shielding plate 60 covers the signal transmission units 52, prevents damage to the signal transmission units 52 during fabrication, and emits the heat generated from a device 55 to outside. The shielding plate 60 may be coupled to the reinforcing member 41 by various means, including a screw 65 through a first coupling hole 61a of the shielding plate 60 to a second coupling hole 41a of the reinforcing member 41, as shown in FIG. 1.

A tape carrier package (TCP) may be used as the signal transmission unit 52. That is, the TCP, which is formed as a package by mounting a plurality of devices on a tape, may couple the display panel 20 to the circuit units 50. The TCP may include a film layer 52a, a copper layer 52b, and a solder resist (SR) application layer 52c, and it is coupled to both end portions of the device 55 that is disposed on the TCP. The device 55 may be supported by a bumper 57 disposed on the copper layer 52b. Since the TCP is formed of tape, it is flexible, and it may have a plurality of devices mounted on it, including a driving circuit device. Thus, the TCP is widely used to reduce a size of the circuit unit.

However, the devices mounted on the TCP may generate large heat when driving the display panel, which degrades the panel's display performance, reduces circuit unit reliability if the display panel is driven for a long time, and damages the panel substrates by transferring heat stress to them. Further, because the device mounted on the TCP is about 2 mm×6 mm, an effective unit for emitting the heat is required.

Therefore, as shown in FIG. 2, thermal conductive grease 43 may be applied on an upper surface of the reinforcing member 41, and a lower heat radiation member 45 may be formed so as to fill a gap between the device 55 and the TCP 52. Additionally, the upper portion of the device 55 is covered by the shielding plate 60, on which a thermal conductive sheet 63 is attached. Therefore, heat generated from the upper and lower portions of the device may be easily diffused.

An area of the upper surface of the device is typically about 12 mm$^2$, and an area of a lateral surface of the device is typically about 8 mm$^2$. Hence, the diffusion of heat through the side surface of the device is an important factor in a thermal conductive efficiency. However, the above device may not have a heat radiation unit on its side, thus the heat radiated through its side may not be diffused well.

SUMMARY OF THE INVENTION

The present invention provides a plasma display apparatus that may sufficiently radiate heat of a device, particularly the heat generated from a side surface of the device.

Additional features of the invention will be set forth in the description which follows, and in part will be apparent from the description, or may be learned by practice of the invention.

The present invention discloses a plasma display apparatus including a display panel, a chassis base supporting the display panel, and a circuit unit supported by the chassis base and for driving the display panel. A signal transmission unit couples the display panel and the circuit unit, and including at least one mounted device. A lateral heat radiation member surrounds a lateral portion of the device to diffuse heat from the lateral portion of the device.

The present invention also discloses a plasma display apparatus including a display panel, a chassis base supporting the display panel, and a circuit unit supported by the chassis base and for driving the display panel. A signal transmission unit couples the display panel and the circuit unit, and includes at least one mounted device. A shielding plate covers the signal transmission unit and an upper portion of the device. A thermal conductive sheet is formed on a portion of a lower surface of the shielding plate corresponding to the device. The thermal conductive sheet is at least 0.8 mm thick and it diffuses heat from upper and lateral portions of the device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Figure 1:
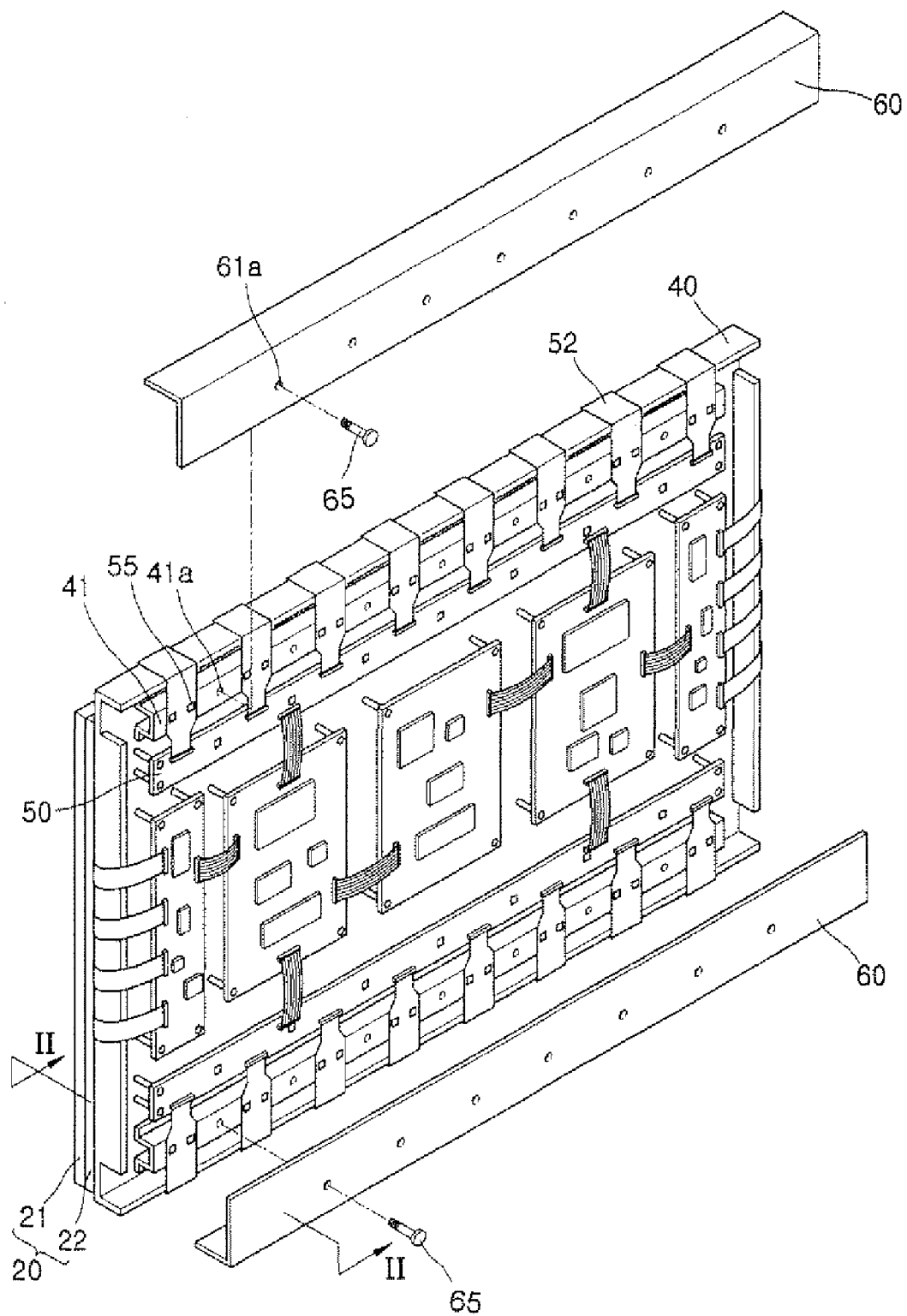
FIG. 1 is a perspective view showing a conventional plasma display apparatus.
Figure 2:
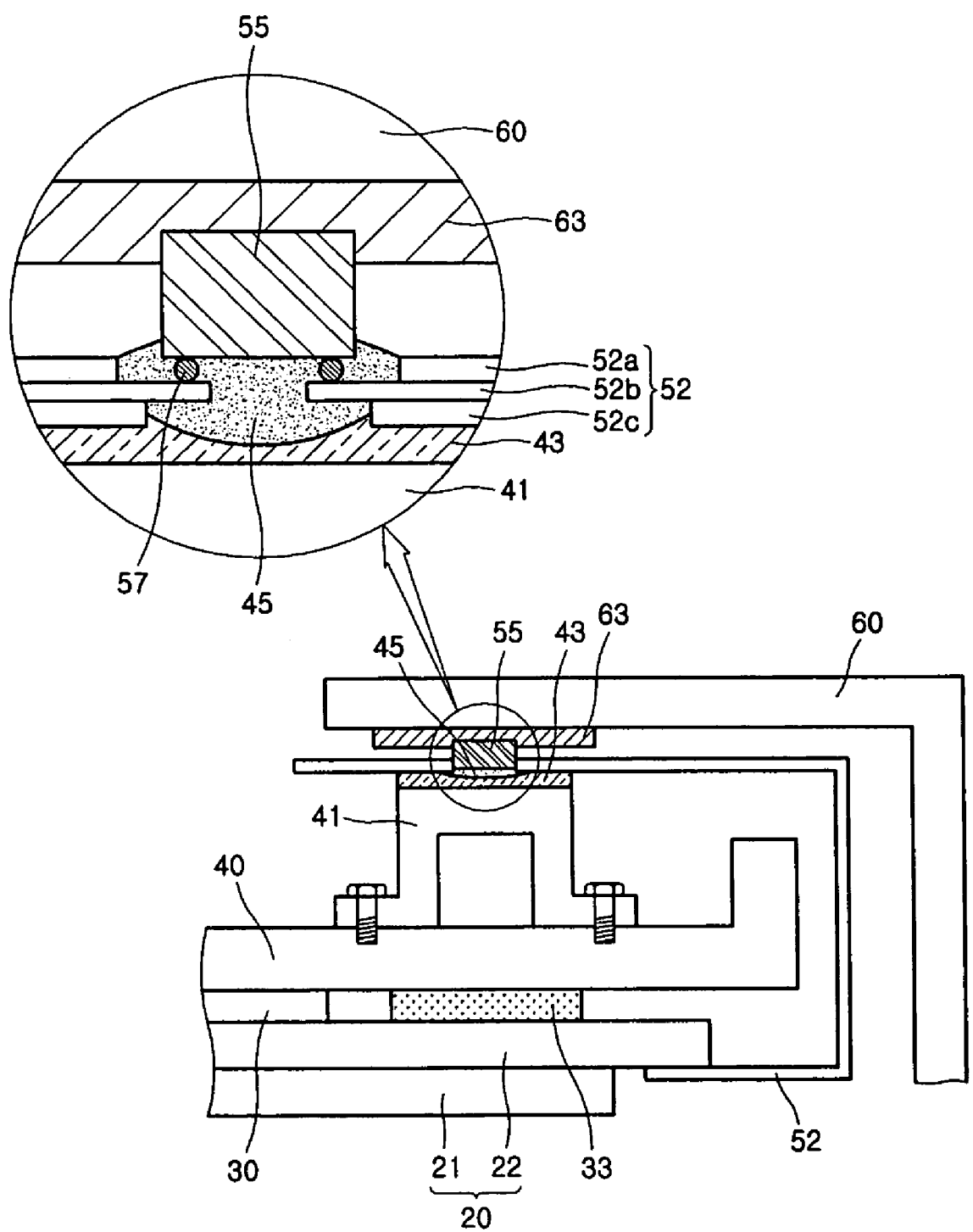
FIG. 2 is a cross-sectional view taken along the line II-II of FIG. 1.
Figure 3:
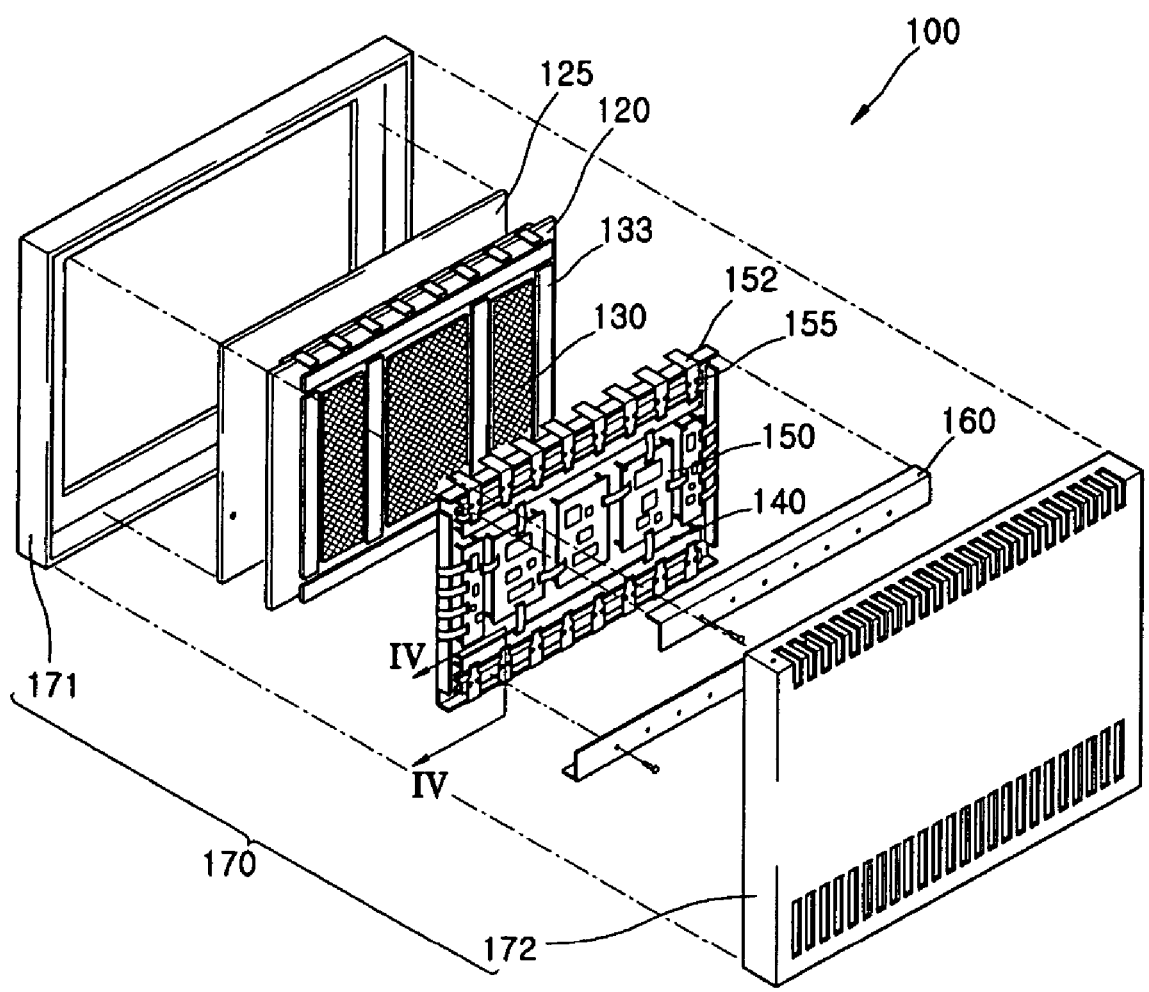
FIG. 3 is an exploded perspective view showing a plasma display apparatus according to a first exemplary embodiment of the present invention.

Referring to FIG. 3, a plasma display apparatus 100 according to a first exemplary embodiment of the present invention includes a display panel 120, a chassis base 140 for supporting the display panel 120, and a circuit unit 150 that is installed on a rear portion of the chassis base 140.

Figure 4:
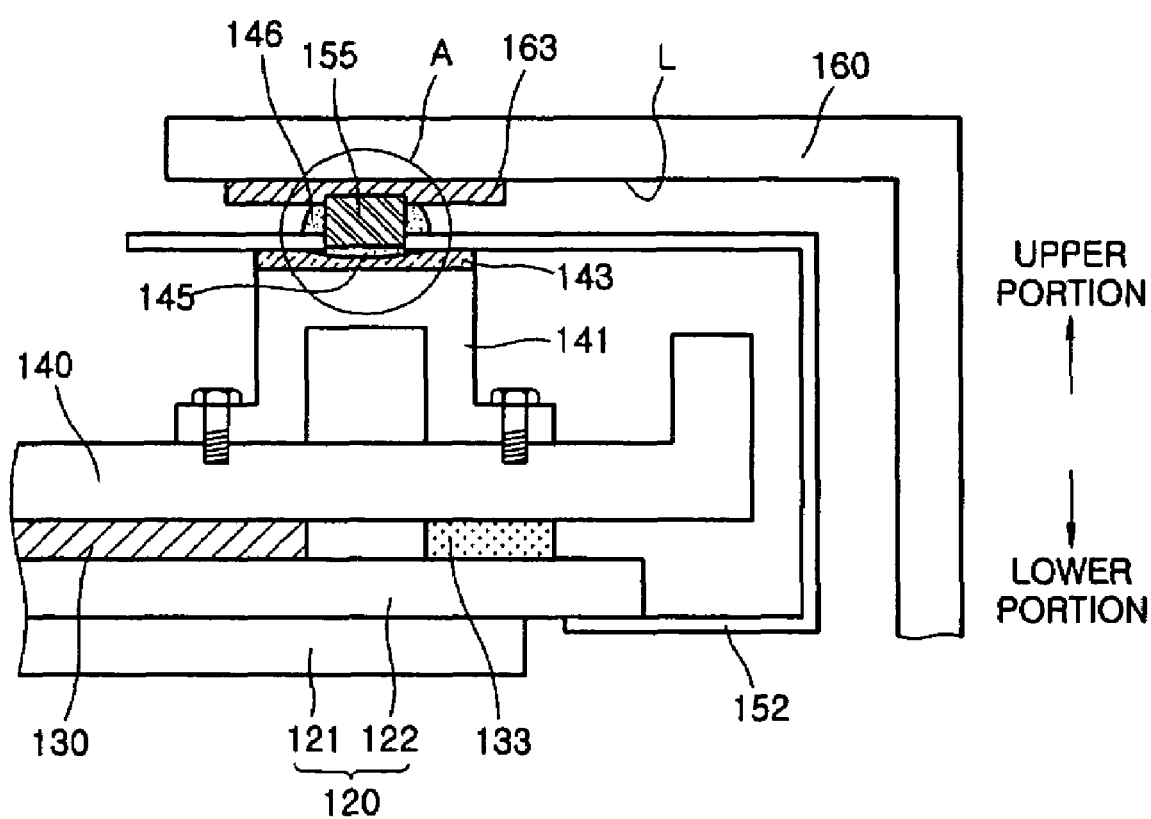
FIG. 4 is a cross-sectional view taken along the line IV-IV of FIG. 3.

As shown in FIG. 4, the display panel 120 includes a front panel 121 and a back panel 122. In a general surface discharge type three-electrode plasma display panel, the front panel 121 typically includes a plurality pairs of sustain electrodes, a front dielectric layer covering the sustain electrode pairs, and a protective layer covering the front dielectric layer. The back panel faces the front panel, and it typically includes a plurality of address electrodes, a back dielectric layer covering the address electrodes, barrier ribs formed on the back dielectric layer, and a phosphor layer.

A filter 125 may be installed on a front surface of the display panel 120 to shield potentially harmful electromagnetic waves generated during its operation.

The chassis base 140 is disposed on a rear portion of the display panel 120.

The display panel 120 and the chassis base 140 may be coupled by a coupling member, such as dual-adhesive tape 133. Additionally, a panel heat radiation member 130 may be disposed between the display panel 120 and the chassis base 140. The panel heat radiation member 130 discharges heat generated on the display panel 120 to the outside through the chassis base 140.

The circuit unit 150 may be mounted on a rear portion of the chassis base 140. The circuit unit 150 may include electronic elements for driving the display panel 120, and the electronic elements may further include elements for supplying power and for applying signals to the display panel 120 to display images.

The display panel 120 and the chassis base 140 may be housed in a case 170, and the case 170 may include a front cabinet 171, which is installed on a front portion of the display panel 120, and a back cover 172, which is installed on a rear portion of the chassis base 140.

The circuit unit 150 drives the display panel 120 by transmitting electrical signals through the signal transmission unit 152, and at least a device 155 is mounted on the signal transmission unit 152. The shielding plate 160 protects the signal transmission unit 152.

Referring to FIG. 4, the signal transmission unit 152 has an end that is coupled to the display panel 120 and another end that is coupled to the circuit unit 150 (refer to FIG. 3) through an upper end portion of the chassis base 140. A device 155 mounted on the signal transmission unit 152 may be directly mounted on the chassis base 140, or it may be mounted on the reinforcing member 141 that is installed on a side of the chassis base 140.

The reinforcing member 141 may be formed of a metal material, and it may prevent the chassis base 140 from cambering and improve the heat radiating efficiency by increasing the area of the chassis base 140 for radiating heat. Thus, both ends of the reinforcing member 141 may be fixed on the chassis base 140 as shown in FIG. 4, or one end of the reinforcing member 141 may be fixed on the chassis base 140 and the other end may be installed on a bent portion of the chassis base 140.

Here, a thermal conductive grease 143 may be further disposed between the device 155 and the reinforcing member 141.

A shielding plate 160 may be included in order to protect the outside of the signal transmission unit 152, including the upper portion of the device 155. The shielding plate 160 may be formed of a metal, such as aluminium. The shielding plate 160 may be formed as an overturned 'L' covering the outside of the signal transmission unit 152, and a thermal conductive sheet 163 may be disposed on a portion of the lower surface of the shielding plate 160 at a portion corresponding to the upper surface of the device 155. Additionally, a lateral heat radiation member 146, which surrounds the lateral portion of the device 155, may be formed on the device's side portion, and a lower heat radiation member 145, which surrounds the lower portion of the device 155, may be formed on the device's lower portion.

In the present invention, since at least one device 155 may be mounted on the TCP, high heat may be generated on the driving circuit device, and an additional heat radiation plate is not formed on the TCP, unlike a chip on film (COF), and the TCP may be effectively used as the signal transmission unit 152.

Figure 5:
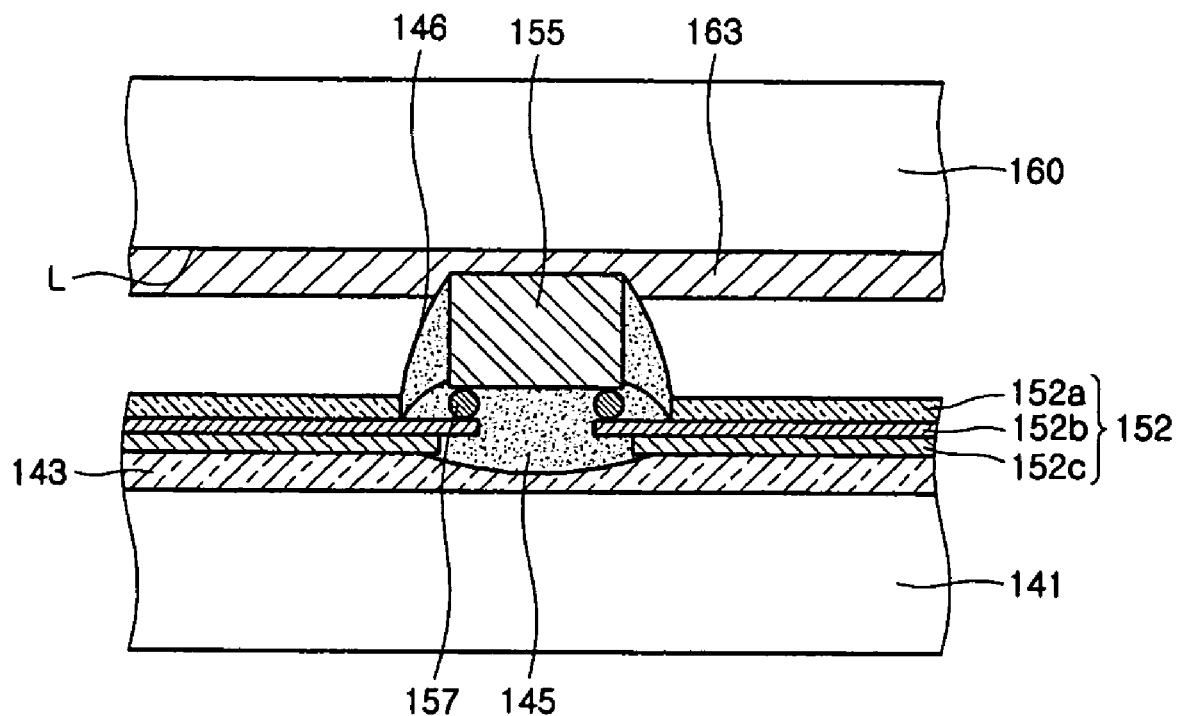
FIG. 5 is a cross-sectional view showing an expanded part A of FIG. 4.

Referring to FIG. 5, which is a magnified view of Area A of FIG. 4, the heat radiation unit of the device 155 in the plasma display apparatus 100 according to the first exemplary embodiment of the present invention will be described as follows. The signal transmission unit 152 generally includes a film layer 152$a$, a copper layer 152$b$, and a solder resist (SR) application layer 152$c$. The device 155 has a bumper 157 that is disposed on the copper layer 152$b$, and the device 155 is mounted on the signal transmission unit 152 by the bumper 157.

The plasma display apparatus 100 of the first exemplary embodiment includes the lateral heat radiation member 146. The lateral heat radiation member 146 surrounds the lateral portion of the device 155 to diffuse the heat generated on the device's lateral portion. The lateral heat radiation member 146 may include an epoxy resin, or it may be formed of the epoxy resin.

Alternatively, the lateral heat radiation member 146 may be formed of a ceramic based material. Since ceramic has superior thermal conductive and radiation efficiencies, the heat radiating efficiency of the device 155 may be improved.

Additionally, the shielding plate 160 may be disposed on the upper portion of the signal transmission unit 152, and the thermal conductive sheet 163, which diffuses the heat that is discharged through the upper portion of the device 155, may be formed on a portion on the lower surface L of the shielding plate 160 corresponding to the device 155. The lateral heat radiation member 146 may contact the thermal conductive sheet 163 in order to diffuse the heat discharged from the upper and lateral portions of the device 155 without a gap.

A lower heat radiation member 145, which surrounds the lower portion of the device 155 to diffuse heat generated there, may be formed on the lower portion of the device 155. The lateral heat radiation member 146 may contact the lower heat radiation member 145 in order to effectively diffuse the heat generated from the device's lateral and lower portions.

Figure 6:
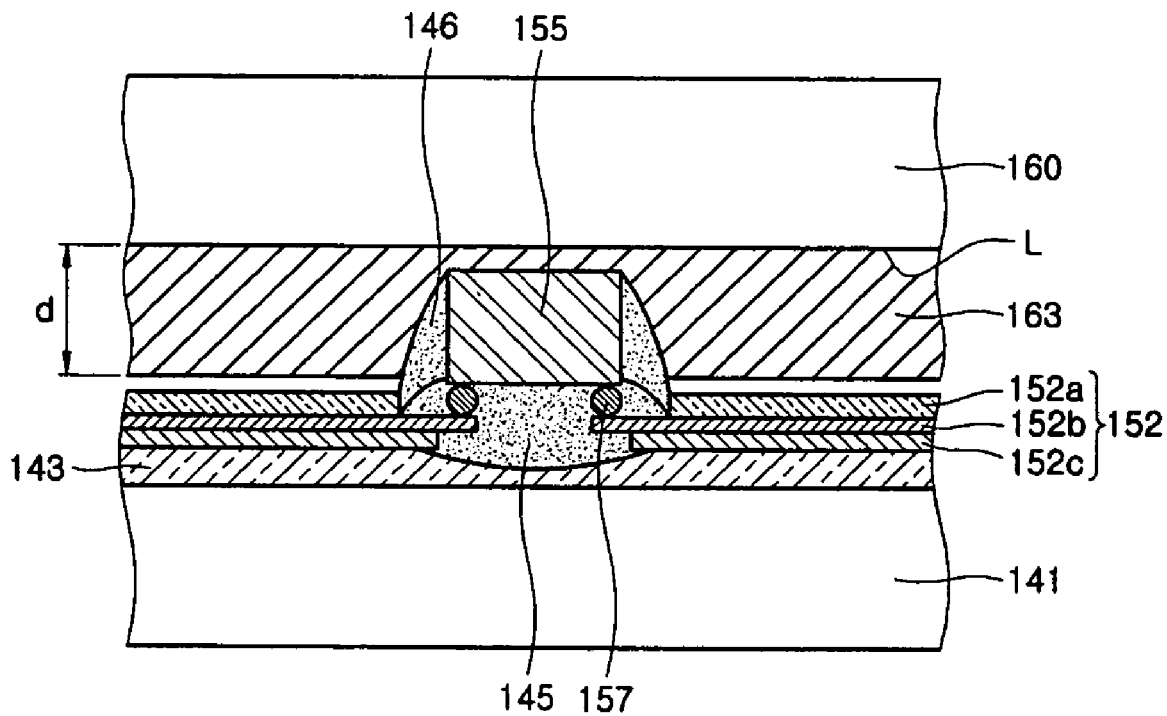
FIG. 6 is a cross-sectional view showing a modified example of part A of FIG. 5.

Here, as shown in FIG. 6, the thermal conductive sheet 163 may be formed of a soft material that is 0.8 mm or more thick (d≧0.8 mm). Since the device 155 is generally about 0.5 mm thick, when the thermal conductive sheet 163 is at least 0.8 mm thick, the thermal conductive sheet 163 may completely cover the lateral surface of the device 155 and the lateral heat radiation member 146, thus improving the heat radiating efficiency and preventing stress damage to the device 155 that may be caused by a tolerance error in assembly.

Therefore, according to the first exemplary embodiment of the present invention, the shielding plate 160 and the thermal conductive sheet 163 surround the upper portion of the device 155. The lower heat radiation member 145 and the thermal conductive grease 143 surround the lower portion of the device 155, and the lateral heat radiation member 146 surrounds the lateral portion of the device 155.

Thus, the heat generated on the upper portion of the device 155 may be diffused to outside through the thermal conductive sheet 163 and the shielding plate 160, and the heat generated on the lower portion of the device 155 may be diffused to outside through the lower heat radiation member 145 and the thermal conductive grease 143. Additionally, the heat generated on the lateral portion of the device 155 may be diffused to outside through the lateral heat radiation member 146. Therefore, the heat radiating efficiency of the device 155 may be improved. In other words, since the cross sectional area of the device 155 is generally about 12 mm$^2$ and the area of the lateral portion is about 8 mm$^2$, the area of the device 155, through which the heat is conducted, increases by 67% over a conventional device having no lateral heat radiation member, thus improving the heat radiating efficiency of the device.

If the lower heat radiation member 145 is generally formed of the epoxy resin, it is desirable that the lateral heat radiation member 146 be integrally formed with the lower heat radiation member 145 using the same material.

Figure 7:
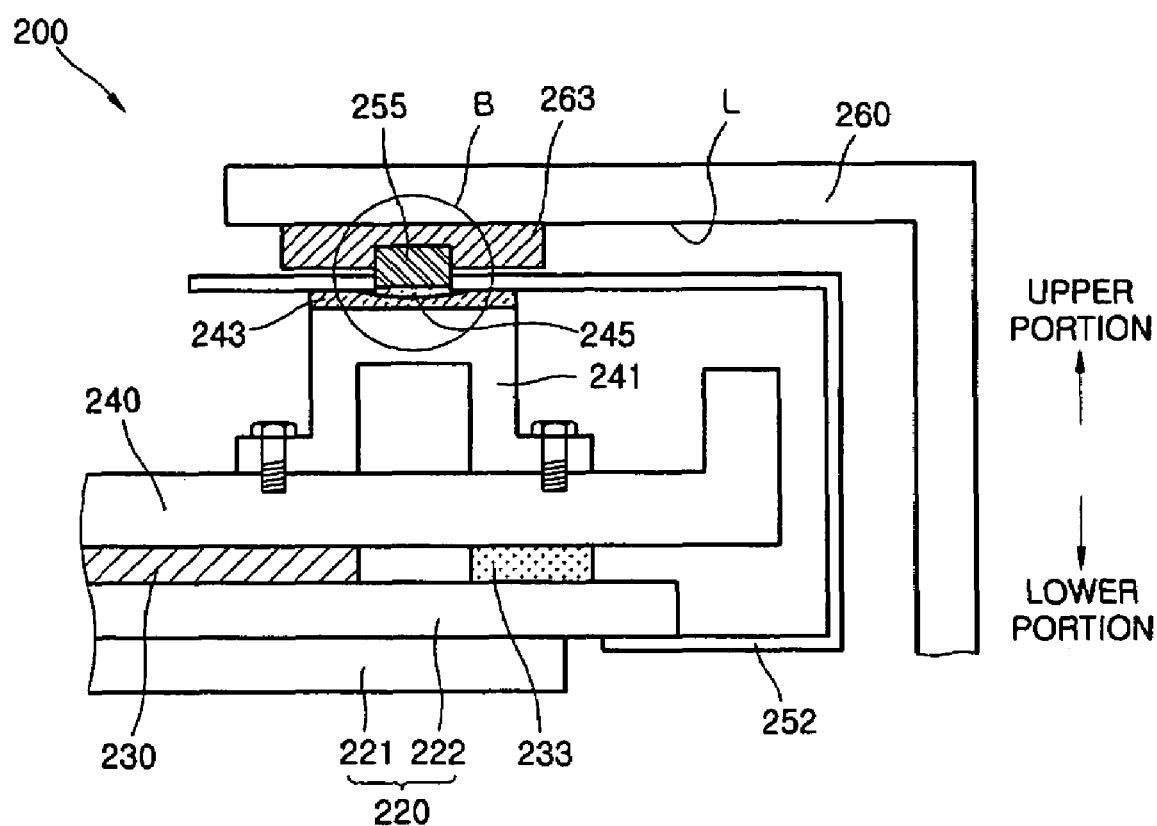
FIG. 7 is a cross-sectional view showing a device in a plasma display apparatus according to a second exemplary embodiment of the present invention.

FIG. 7 shows a plasma display apparatus according to a second exemplary embodiment of the present invention. Referring to FIG. 7, the plasma display apparatus 200 includes a display panel 220, a circuit unit 150 (refer to FIG. 3), a chassis base 240, a signal transmission unit 252, a shielding plate 260, and a thermal conductive sheet 263.

The plasma display panel 220 includes a front panel 221 and a back panel 222 to display the images, and it is driven by the circuit unit 150 (refer to FIG. 3).

The display panel 220 and the circuit unit 150 are supported by the chassis base 240, which may be coupled to the display panel 220 by an adhesive member such as a dual-adhesive tape 233. Additionally, a heat radiation unit 230 may be disposed between the display panel 220 and the chassis base 240. A reinforcing member 241 may be coupled with the chassis base 240 to prevent the chassis base 240 from cambering. The reinforcing member 241 and the chassis base 240 may be formed integrally with each other.

The signal transmission unit 252 couples the display panel 220 to the circuit unit 150. The signal transmission unit 252 transmits electric signals between the display panel 220 and the circuit unit 150. Additionally, the signal transmission unit 252 may be formed along the upper portion of the reinforcing member 241, and it may include one or more devices 255 mounted at a center portion thereof. A lower heat radiation member 245 may be formed on a lower portion of the device 255, and thermal conductive grease 243 may be formed on the upper surface of the reinforcing member 241.

A TCP may be used as the signal transmission unit 252. The signal transmission unit 252 passes through the upper end portion of the chassis base 240, and has one end coupled to the display panel 220 and the other end coupled to the circuit unit 150.

A thermal conductive sheet 263 may be disposed on a lower surface L of the shielding plate 260.

Figure 8:
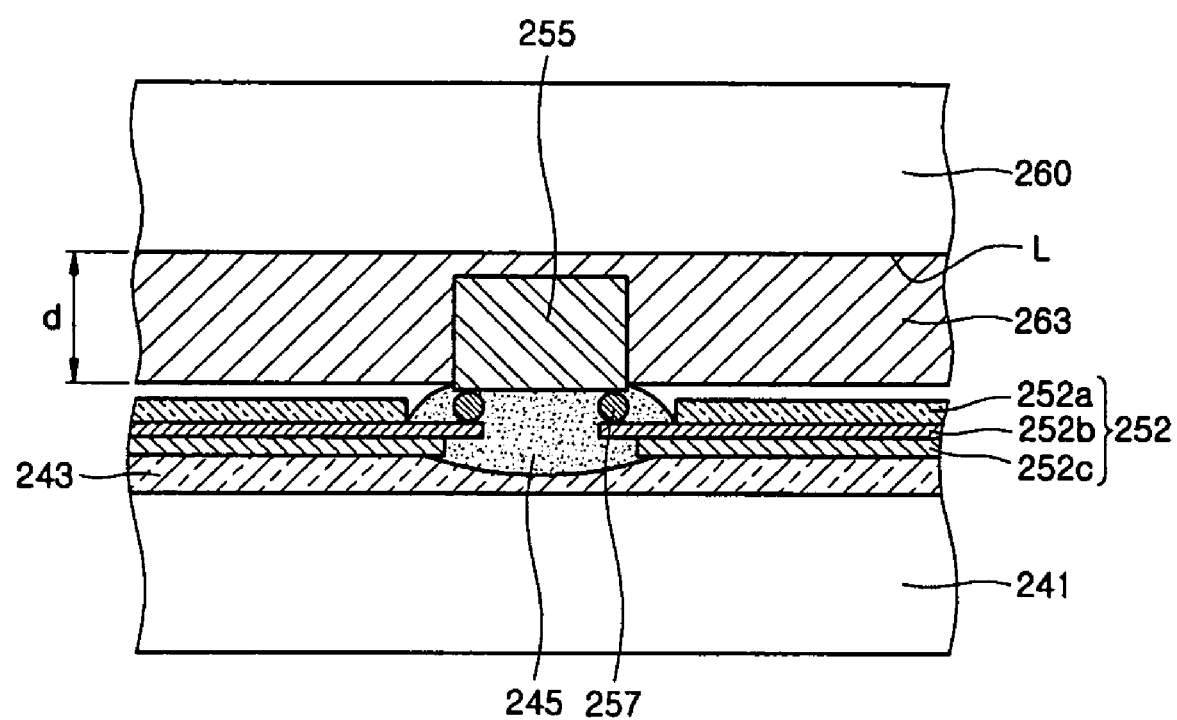
FIG. 8 is a cross-sectional view showing an expanded part B of FIG. 7.

Referring to FIG. 8, which is a magnified view of Area B of FIG. 7, the signal transmission unit 252 includes a film layer 252*a*, a copper layer 252*b*, and an SR application layer 252*c*. Both ends of the device 255 are formed on the copper layer 252*b*, and a bumper 257 is disposed under the device 255. The device 255 may be disposed on the reinforcing member 241 that is installed on a side portion of the chassis base 240.

Here, the display panel 220, the circuit unit 150 (refer to FIG. 3), the chassis base 240 (refer to FIG. 7), the reinforcing member 241, and the shielding plate 270 have the same structures and functions as those of the display panel 120, the circuit unit 150, the chassis base 140, the reinforcing member 141, and the shielding plate 160 of the first exemplary embodiment of the present invention, thus detailed descriptions for those are omitted.

The thermal conductive sheet 263 may be disposed on a lower surface L of the shielding plate 260. The thermal conductive sheet 263 may be formed of a soft material, and it may be at least 0.8 mm thick (d≧0.8 mm). Since the device 255 is about 0.5 mm thick and the heat radiation sheet 263 is at least 0.8 mm thick, the lateral surface of the device 255 may be completely covered, which improves the heat radiation efficiency. That is, since the area of the upper surface of the device 255 is about 12 mm$^2$ and the area of the device's lateral surface is about 8 mm$^2$, the area of the device 255, through which the heat is conducted, may increase by about 67% as compared to the conventional art, thus improving the heat radiating function of the device 255.

Additionally, damage to the device 255 caused by pressure concentrated on the device 255 due to a tolerance error during assembly may be prevented.

The lower heat radiation member 245, which surrounds the lower portion of the device 255 to diffuse the heat generated on the device's lower portion, is formed under the device 255. The thermal conductive sheet 263 may contact the lower heat radiation member 245, since the device 255 may be completely surrounded by them, and thus the heat radiation efficiency may be improved.

According to exemplary embodiments of the plasma display apparatus of the present invention, heat generated by the device, and particularly, heat generated on the lateral portion of the device, may be sufficiently diffused, thus improving the device's heat radiation efficiency.

Therefore, the panel's display performance may not be degraded, and the reliability of the circuit unit may be ensured even when the display panel operates for a long time.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display apparatus, comprising:
   a display panel;
   a chassis base supporting the display panel;
   a circuit unit supported by the chassis base and for driving the display panel;
   a signal transmission unit coupling the display panel to the circuit unit, and having at least one device mounted on the signal transmission unit;

a lateral heat radiation member covering a lateral portion of the device and not covering a part of an upper portion of the device;

a shielding plate; and a thermal conductive sheet formed on a portion of a lower surface of the shielding plate corresponding to the signal transmission unit, wherein the shielding plate covers an outside of the signal transmission unit and an upper portion of the device, and wherein the thermal conductive sheet diffuses heat from the upper portion of the device, contacts the lateral heat radiation member, and is at least 0.8 mm thick.

2. The apparatus of claim 1, wherein the signal transmission unit is a tape carrier package.

3. The apparatus of claim 2, wherein the lateral heat radiation member comprises an epoxy resin.

4. The apparatus of claim 2, wherein the lateral heat radiation member comprises a ceramic material.

5. The apparatus of claim 1, further comprising:

a lower heat radiation member surrounding a lower portion of the device, wherein the lower heat radiation member contacts the lateral heat radiation member.

6. The apparatus of claim 5, wherein the lower heat radiation member and the lateral heat radiation member are formed of the same material.

7. The apparatus of claim 6, further comprising a reinforcing member formed between the chassis base and the device, wherein the lower heat radiation member contacts thermal conductive grease on the reinforcing member.

8. The apparatus of claim 7, wherein the reinforcing member contacts the chassis base.

9. The apparatus of claim 5, further comprising a reinforcing member formed between the chassis base and the device, wherein the lower heat radiation member contacts thermal conductive grease on the reinforcing member.

10. A plasma display apparatus, comprising:

a display panel;

a chassis base supporting the display panel;

a circuit unit supported by the chassis base and for driving the display panel;

a signal transmission unit coupling the display panel and the circuit unit, and having at least one device mounted on the signal transmission unit;

a shielding plate covering the signal transmission unit and an upper portion of the device; and a thermal conductive sheet formed on a portion of a lower surface of the shielding plate corresponding to the device to diffuse heat from upper and lateral portions the device, wherein a thickness of the thermal conductive sheet is at least 0.8 mm thick when the thermal conductive sheet does not contact the device.

11. The apparatus of claim 10, wherein the signal transmission unit is a tape carrier package.

12. The apparatus of claim 11, further comprising:

a lower heat radiation member surrounding a lower portion of the device to diffuse heat from the lower portion of the device, wherein the lower heat radiation member contacts the thermal conductive sheet.

13. The apparatus of claim 12, further comprising:

a reinforcing member formed between the chassis base and the device, wherein the lower heat radiation member contacts thermal conductive grease on the reinforcing member.

14. The apparatus of claim 13, wherein the reinforcing member is integrally formed with the chassis base.

* * * * *